Figure 1:
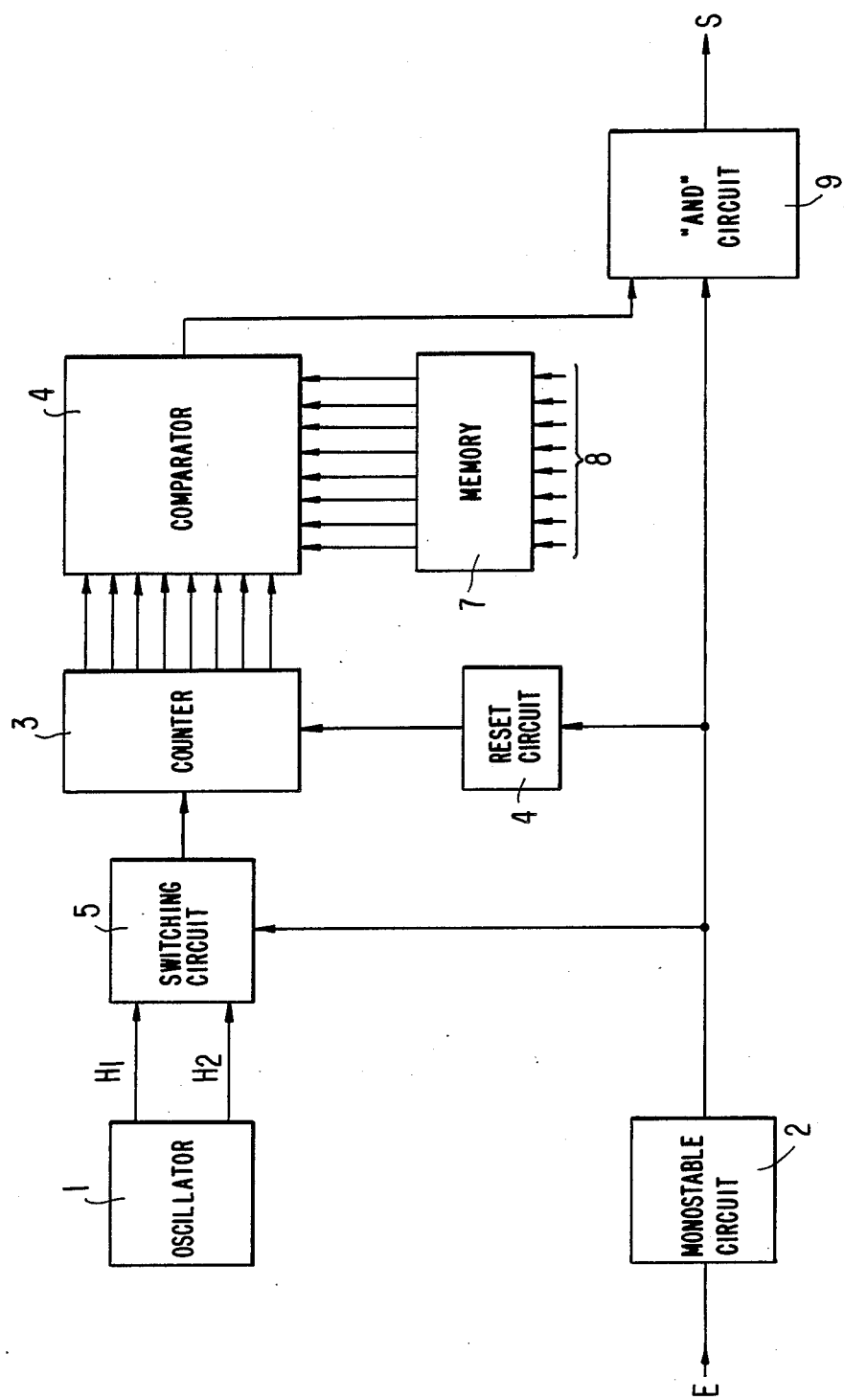

United States Patent [19]

Camus

[11] Patent Number: 4,710,721
[45] Date of Patent: Dec. 1, 1987

[54] APPARATUS FOR MONITORING THE PERIOD OF SEPARATION OF IMPULSES

[75] Inventor: Etienne Camus, Senlis, France

[73] Assignee: Jeumont-Schneider Corporation, Puteaux, France

[21] Appl. No.: 831,422

[22] Filed: Feb. 20, 1986

[30] Foreign Application Priority Data

Feb. 21, 1985 [FR] France .................. 85 02483

[51] Int. Cl.[4] .................. H03K 5/22; G01R 19/145
[52] U.S. Cl. .................. 328/109; 328/111; 307/518; 307/234
[58] Field of Search ............... 307/518, 234, 360, 355; 328/111, 120, 109, 140, 141, 146

[56] References Cited

U.S. PATENT DOCUMENTS

| 3,737,789 | 6/1973 | McCoy et al. | 328/138 |
| 3,961,271 | 6/1976 | Zlydak et al. | 307/234 |
| 4,353,091 | 10/1982 | Hoppe | 307/234 |
| 4,403,185 | 9/1983 | Charles | 324/78 |

FOREIGN PATENT DOCUMENTS 1293839 4/1969 Fed. Rep. of Germany .

OTHER PUBLICATIONS

Patents Abstract of Japan, vol. 7, No. 38 (P-176) [1183], Feb. 16, 1983; & JP-A-57 190 273 (Mitsubishi Denki (K.K.)) 22.11.1982.

Primary Examiner—Stanley D. Miller
Assistant Examiner—Timothy P. Callahan
Attorney, Agent, or Firm—Rines and Rines, Shapiro and Shapiro

[57] ABSTRACT

A circuit monitors the period of separation between impulses and provides an output only when the period of separation between successive impulses is substantially the same as a predeterimed period. The impulses are applied to a monostable circuit which produces pulses of fixed duration in response. A switching circuit controlled by the pulses switches a binary counter to be driven by a low frequency oscillator output between pulses and by a high frequency oscillator output during pulses, the counter being reset to zero at the trailing edge of each pulse. A comparator determines whether, before reset, the counter reaches a count corresponding to the predetermined period and provides an output pulse to an AND circuit input when the count is reached. The AND circuit has another input connected to the monostable circuit output and thus provides an output pulse when the comparator output is coincident with a corresponding pulse from the monostable circuit. The high and low oscillator frequencies and the pulse duration of the monostable circuit are selected such that the counter will reach the predetermined count if the input impulse separation is substantially the same as the predetermined period.

7 Claims, 7 Drawing Figures

APPARATUS FOR MONITORING THE PERIOD OF SEPARATION OF IMPULSES

The present invention concerns an apparatus for monitoring the period of separation of impulses. Such an apparatus can be utilized in particular in railway circuits, in order to ensure that the signals detected in these circuits correctly correspond to the signals sent.

Numerous random parasitic signals are generated in the rails of railroad, notably due to the interrupters utilized for control of traction motors. Certain of these parasitic impulses display an amplitude such that the impulse receiving portion of a track communications circuit could confuse such impulses with actual data impulses emitted into the rails by a sending portion of the track circuit, and thus could indicate, for example, the absence of any train over the given track section, while in fact there is a train present.

It is thus necessary to test whether the impulse entering the receiving circuit is in fact the emitted impulse. Because the period of these impulses is well defined, while that of the parasitic impulses is random, the object of the invention may be attained by verifying the length of the period between two successivley received impulses. Taking account of the envisioned application, the monitoring must naturally be carried out with reliability.

In summary, the apparatus according to the invention is essentially characterized in that it includes, in combination:

- an oscillator furnishing a signal with a low frequency and a signal with a high frequency;
- a monostable circuit providing in response to from the input impulses to be monitored, pulses with a determined width;
- a binary counter, which is reset to zero by the falling edge of the pulses from the monostable circuit;
- a switching circuit controlled by the pulses from the circuit, in such a way that the binary counter is driven by the low frequency signal from the oscillator between such pulses, and by the high frequency signal during the pulses;
- a comparator, to compare the number supplied by the counter with a predetermined number previously stored in a memory, and corresponding essentially to the period to be monitored, with this comparator generating an impulse at its output when the two numbers coincide; and
- an AND coincidence circuit whose two inputs are connected respectively to the output of the comparator and the output of the monostable circuit.

By virtue of this arrangement, there is obtained an impulse at the output of the AND circuit only if the predetermined number stored in memory is reached by the counter during the phase of accelerated counting. Thus there is reliable monitoring of the period of impulse input over a fixed bracket, which, for a given peak length, depends essentially upon the relation between the high frequency and the low frequency.

The invention will be better understood, and other objects, advantages, and characteristics of the invention will become more clear, from the description which follows, given by way of non-limitational example, to which two figures are appended:

FIG. 1 is a block diagram of a monitoring apparatus conforming to the invention, and FIGS. 2A to 2F are diagrams illustrating the functioning of this apparatus.

The apparatus represented in FIG. 1 comprises first an oscillator 1, supplying respectively at two outputs a first signal, with a low frequency $H_1$, and a second signal, with a high frequency $H_2$. These two frequencies are in a large ratio to one another, such as $2^8$. The impulses to be monitored are applied at the input E of the apparatus, and are represented in FIG. 2A.

Figure 2:
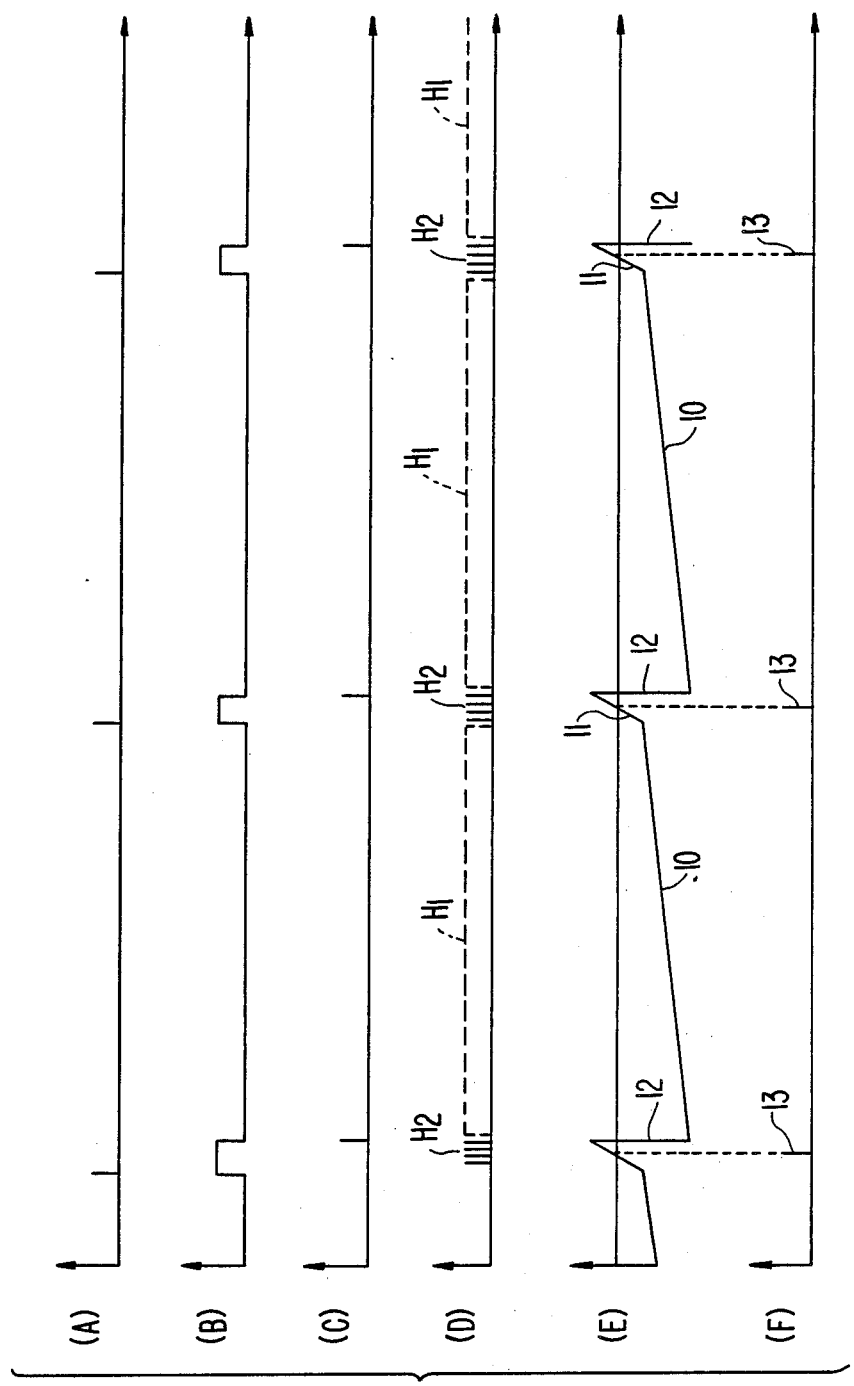

The input E of the apparatus is connected to a monostable 2, which, in response the input impulses to be monitored, delivers at its output pulses of a determined width, as represented in FIG. 2B.

The heart of the apparatus is constituted by a binary counter 3, driven by the oscillator 1, which thus delivers at its output, for example as eight binary bits, a binary number whose value is a function of the number of impulses which have been applied at its input.

The resetting to zero of this counter is effected by a reset circuit 4 which is triggered by the falling (trailing) edge of the peaks coming from the monostable circuit 2. The configuration of the reset pulses is represented by the diagram of FIG. 2C.

Between the oscillator 1 and the counter 3 is placed a switching circuit 5 which is controlled by the monostable circuit output pulses and which operates such thus that the binary counter is thus driven by the low frequency signal $H_1$ between the pulses, and by the high frequency signal $H_2$ during the pulses, as illustrated by the diagram of FIG. 2D.

A comparator 6, with eight bits, at each instant compares the binary number registered in the counter 3 with a predetermined number previously stored in a programmable or linked memory 7, and emits an impulse at its output when the two numbers coincide. This predetermined number corresponds to the period to be monitored, between input impulses, and it is written into the memory 7 by means of the inputs 8.

The monitoring apparatus according to the invention is complemented by an AND coincidence circuit 9, of familiar type, with intrinsic reliability, whose two inputs are respectively connected to the output of the monostable circuit 2 and the output of the comparator 6, and whose output constitutes the output 5 of the apparatus as a whole.

The operation of this apparatus will now be described, referring more particularly to FIG. 2E, which is an explanatory diagram illustrating the counting mode of the counter 3.

After a resetting to zero, the counter is first driven by the low frequency signal $H_1$, and performs a slow counting, represented at 10 in FIG. 2E. When the subsequent impulse arrives, at input E, monostable circuit 2 outputs a pulse, and switching circuit 5 changes over so that the counter is driven by the high frequency signal $H_2$. Counting is thus accelerated throughout the duration of the monostable circuit output pulse, as represented at 11 in FIG. 2E. At the end of this pulse, the counter is reset to zero, as represented at 12.

If the predetermined number written into the memory 7 is reached by the counter 3 during the accelerated counting phase 11, the comparator 6 emits an impulse to the coincidence AND circuit 9, as represented at 13 in the diagram of FIG. 2F. Moreover, since this impulse is emitted during the corresponding pulse applied to the other input of the AND circuit by monostable circuit 2, an impulse is also produced at the output S.

It will thus to be seen that with the monitoring apparatus according to the invention, an impulse is obtained at the output S only if the predetermined number placed in memory is reached by the counter during the phase of accelerated counting. This enables secure monitoring of the period of impulses applied at the input E, within a fixed bracket of absolute value. Of course, the number in memory must correspond to the longest period to be monitored.

By way of example, if the period to be monitored is about 300 ms, a frequency $H_1$ corresponding to a period of 833 $\mu$s can be adopted, which yields for $H_2$ a period of 3.25 $\mu$s, with a ratio of $2^8$. If it is then assumed that the peaks delivered by the monostable circuit 2 have a duration of 13 $\mu$s, there will be four $H_2$ impulses (counts) during the accelerated counting phase ($4 \times 3.25$ $\mu$s = 13 $\mu$s). The monitored bracket is thus $4 \times 833$ $\mu$s, or about 3.33 ms.

Under these conditions, if N is the predetermined number (in decimal) placed in memory, the longest period monitored will be equal to $N \times 833$ $\mu$s, while the shortest period monitored will be equal to $(N-4) \times 833$ $\mu$s.

Although only one mode of embodiment has been described, it is obvious that various modifications are possible which will not constitute a departure from the framework of the present invention. For example, it is preferable to utilize an oscillator of very high frequency, with which is associated with one or two dividers of the rapid counter type, delivering the low frequency impulses and the high frequency impulses.

Quite evidently, it is useful to reset these impulses regularly, an it is useful to utilize the impulse received at the input of the apparatus to reset the rapid counter or counters to zero, resetting from there being carried out automatically upon processing of any new impulse received.

I claim:

1. Apparatus for monitoring the period of separation between impulses, comprising a monostable circuit having an input to which said impulses are applied and an output on which said monostable circuit generates output pulses in response to the applied input impulses, oscillator circuit means having output means on which said oscillator circuit means generates a high frequency output signal and a low frequency output signal, counter circuit means having input means connected to receive said high frequency signal and said low frequency signal from said output means of said oscillator circuit means, switching circuit means connected for switching an input signal of said counter circuit means between said low frequency signal and said high frequency signal, said switching circuit means having a control input connected to said output of said monostable circuit and switching in response to the output pulses from said monostable circuit such that said counter circuit means is driven by said low frequency signal between output pulses from said monostable circuit and by said high frequency signal during output pulses from said monostable circuit, reset circuit means having a control input connected to said output of said monostable circuit and an output connected to reset said counter circuit means in response to trailing edges of the output pulses from said monostable circuit, comparator circuit means having input means connected to output means of said counter circuit means, said comparator circuit means comparing a number represented by a signal on the output means of said counter circuit means to a number corresponding to a predetermined period to be monitored and providing an output signal when the compared numbers coincide, and AND circuit means having an input connected to the output of said monostable circuit and another input connected to said output means of said comparator circuit means, whereby said AND circuit means provides an output signal when the period between successive impulses applied to the input of said monostable circuit is substantially the same as said predetermined period to be monitored.

2. Apparatus according to claim 1, including a memory connected to additional input means of said comparator circuit means, said memory having said predetermined number stored therein.

3. Apparatus according to claim 1, wherein said counter circuit means comprises a binary counter.

4. Apparatus according to claim 1, wherein said oscillator circuit means generates said low frequency signal on a first output and said high frequency signal on a second output, and wherein said switching circuit means switches an input of said counter circuit means between said first output and said second output of said oscillator circuit means.

5. Apparatus according to claim 1, wherein the output pulses of said monostable circuit are of a duration which is several times the period of said high frequency signal.

6. Apparatus for monitoring the period of separation between impulses, comprising a monostable circuit having an input to which the impulses are applied and an output on which said monostable circuit generates output pulses of a predetermined duration in response to the applied input impulses, oscillator circuit means having a first output and a second output, said oscillator circuit means providing a low frequency signal on said first output and a high frequency signal on said second output, a switching circuit having a first switch input connected to said first output of said oscillator circuit means, a second switch input connected to said second output of said oscillator circuit means, a control input connected to said output of said monostable circuit, and a switched output connected to an input of a binary counter, the output of said switching circuit being switched between said first switch input and said second switch input in response to output pulses from said monostable circuit received at said control input such that the input of said binary counter is switched to said high frequency signal during output pulses from said monostable circuit and to said low frequency signal between output pulses from said monostable circuit, a reset circuit having a control input connected to said output of said monostable circuit and an output connected to a zero-reset terminal of said binary counter, said reset circuit providing a reset pulse to said zero-reset terminal when said monostable circuit returns from a non-stable output state to a stable output state, a comparator having an input connected to an output of said binary counter and another input connected to memory means providing a binary signal representing a predetermined number corresponding to a predetermined period to be monitored, said comparator providing an output signal when a binary number represented by an output signal of said binary counter coincides with said predetermined number, and an AND circuit having one input connected to said output of said monostable circuit and another input connected to an output of said comparator, whereby said AND circuit provides an output signal when the period between successive impulses applied at said input of said monostable circuit is substantially the same as said predetermined period.

7. Apparatus according to claim 6, wherein the duration of the output pulses of said monostable circuit is several times the period of said high frequency signal.

* * * * *